United States Patent [19]

Ishida et al.

[11] Patent Number: 4,600,835

[45] Date of Patent: Jul. 15, 1986

[54] PULSE ENCODER HAVING A CIRCUIT FOR DIAGNOSING ABNORMALITIES

[75] Inventors: Hiroshi Ishida, Tokyo; Shigeyuki Ushiyama, Hino, both of Japan

[73] Assignee: Fanuc Ltd., Japan

[21] Appl. No.: 498,289

[22] Filed: May 26, 1983

[30] Foreign Application Priority Data

May 26, 1982 [JP] Japan .................... 57-88005

[51] Int. Cl.$^4$ .............................. G01D 5/34
[52] U.S. Cl. ..................... 250/231 SE; 250/237 G
[58] Field of Search ............. 250/231 SE, 237 G; 356/395; 361/92, 33; 340/347 P; 33/125 A, 125 C

[56] References Cited

U.S. PATENT DOCUMENTS 4,418,288 11/1983 Imai et al. .................. 307/117
4,423,958 1/1984 Schmitt ..................... 356/375

Primary Examiner—David C. Nelms
Assistant Examiner—James Gatto
Attorney, Agent, or Firm—Armstrong, Nikaido, Marmelstein & Kubovcik

[57] ABSTRACT

A pulse encoder having a circuit for diagnosing abnormalities such as the breaking of wire in LEDs or lowering of a power supply voltage, the pulse encoder comprising LEDs, a rotary lattice plate, a stationary lattice plate, light-receiving elements, and a driving unit for driving the electric signals from the light-receiving elements, the driving unit having a control terminal for controlling the output signal of the driving unit, wherein the anode of one of the LEDs connected to the ground is connected to the control terminal so that when the potential of the control terminal is lowered to a level lower than a predetermined value an alarm signal is output from the driving unit.

7 Claims, 17 Drawing Figures

Fig. 4A
Fig. 4B
Fig. 4C
Fig. 4D
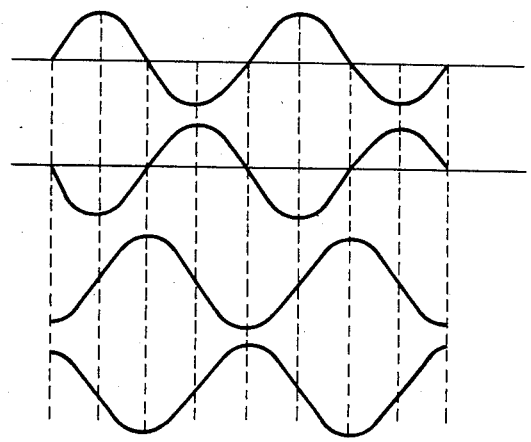
Fig. 4E
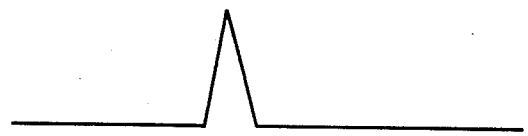
Fig. 5
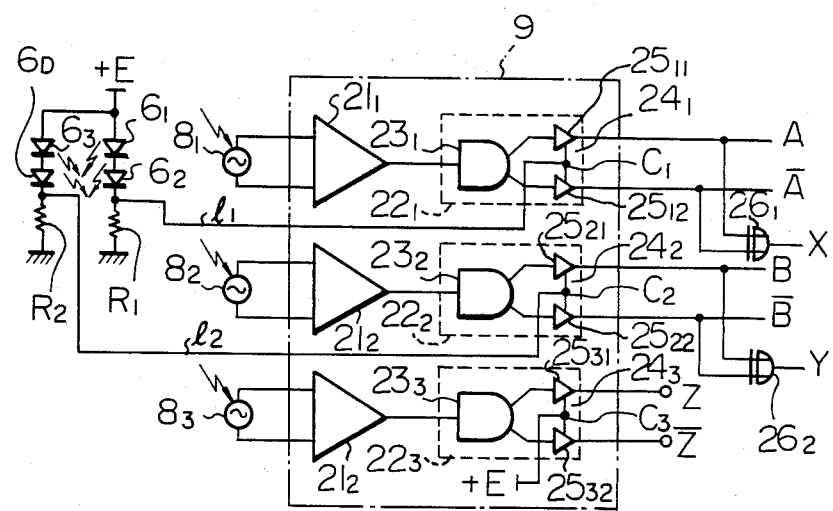

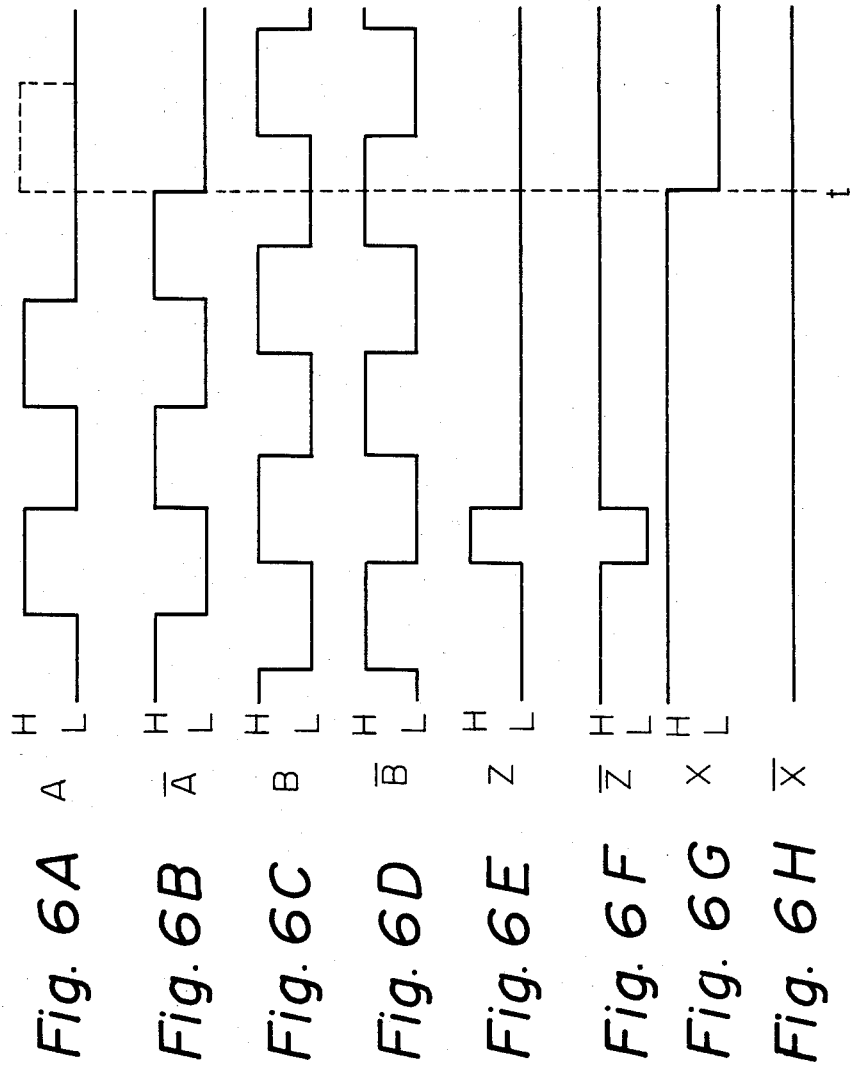

PULSE ENCODER HAVING A CIRCUIT FOR DIAGNOSING ABNORMALITIES

BACKGROUND OF THE INVENTION

1. Field of the Invention

The present invention relates to a pulse encoder having a circuit for diagnosing abnormalities and more particularly to an optical pulse encoder employing light-emitting diodes (hereinafter referred to as LEDs), the pulse encoder having a circuit for detecting abnormalities such as the breaking of wire in LEDs, lowering of the voltage applied to the pulse encoder, a problem in an output transistor in a signal-outputting element, and so forth.

2. Description of the Prior Art

Generally, a pulse encoder detects the angle of rotation and the rotating speed of a motor, and a numerical control device receives the detected outputs from the pulse encoder. The numerical control device controls the angle of rotation and the rotating speed of the motor in accordance with the detected outputs from the pulse encoder so that a load coupled to the axle of the motor is positioned in a desired position.

In the pulse encoder, however, when an above-mentioned abnormality occurs, the output signal of the pulse encoder becomes indefinite. If the numerical control device receives an indefinite signal from the pulse encoder, it cannot control the angle of rotation and the rotating speed of the motor, resulting in uncontrolled running of the numerical control device or the motor.

A conventional pulse encoder does not have a circuit for detecting the above-mentioned abnormalities. Therefore, uncontrolled running of the numerical control device or the motor often occurs.

SUMMARY OF THE INVENTION

Accordingly, an object of the present invention is to provide a pulse encoder which has a circuit for diagnosing abnormalities in a power supply circuit for LEDs included in the pulse encoder.

Another object of the present invention is to provide a pulse encoder in which abnormalities in a power supply circuit for LEDs included in the pulse encoder are detected in an output driving circuit.

Still another object of the present invention is to prevent uncontrolled running of a numerial control device or of a motor controlled by the numerical control device.

To attain the above objects, there is provided a pulse encoder having a circuit for diagnosing abnormalities. The pulse encoder comprises at least one LED having a first electrode connected to a power supply and a second electrode connected to the ground. The pulse encoder also comprises a rotary lattice plate having at least one first transparent portion for intermittently passing therethrough light emitted from the LED and a stationary lattice plate having at least one second transparent portion for passing therethrough part of the light passed through the first transparent portion of the rotary lattice plate. The pulse encoder further comprises at least one light-receiving element for receiving the light passed through the second transparent portion so as to convert the light into an electric signal and a driving unit for converting the electric signal from the light-receiving element into a rectangular waveform signal. The driving unit has an output gate circuit which normally outputs a rectangular waveform signal. The output gate circuit has a control terminal. When the potential at the control terminal is lower than a predetermined value, the output gate circuit outputs a constant-potential output signal. According to the present invention, the circuit for diagnosing abnormalities comprises a lead wire connected between the second electrode of the LED and the control terminal and a means for providing an alarm signal when the output gate circuit provides the constant-potential output signal.

BRIEF DESCRIPTION OF THE DRAWINGS

The above objects and features, as well as other advantages, of the present invention will be more apparent from the following description of the preferred embodiment in conjunction with the accompanying drawings, wherein:

FIGS. 4A through 4E are waveform diagrams of output signals of the pulse encoder of FIG. 1;

FIG. 5 is a circuit diagram illustrating a pulse encoder having a circuit for diagnosing abnormalities, according to an embodiment of the present invention; and FIGS. 6A through 6H are waveform diagrams of the output signals of the circuit of FIG. 5.

DESCRIPTION OF THE PREFERRED EMBODIMENT

An embodiment of the present invention will now be described with reference to the drawings.

Figure 1:
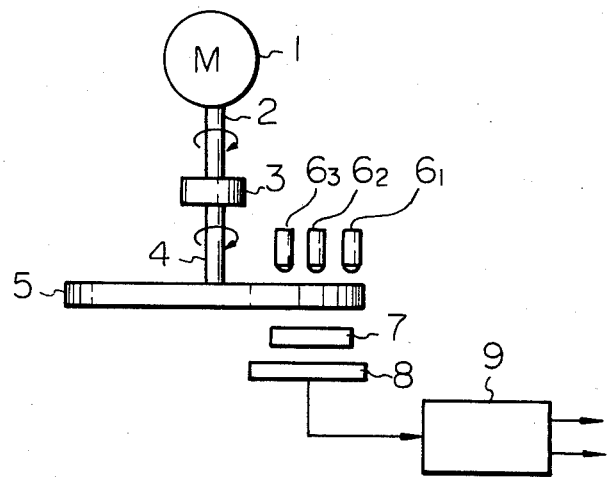
FIG. 1 is a schematic diagram of a pulse encoder of the present invention.

FIG. 1 is a schematic diagram of a pulse encoder of the present invention. In FIG. 1, a motor has a rotating axle 2 which is engaged through a joint 3 with a rotating axle 4. To the rotating axle 4, a rotary lattice plate 5 is fixed. At the upper portion of the rotary lattice plate 5, LEDs $6_1$, $6_2$, and $6_3$ are provided. At the lower portion of the rotary lattice plate 5, a stationary lattice plate 7 is provided. Under the stationary lattice plate 7, a light-receiving unit 8 is provided. The output signal of the light-receiving unit 8 is amplified and wave-form shaped by a driving unit 9. The output signal of the driving unit 9 is input into a numerical control device (not shown).

Figure 2:
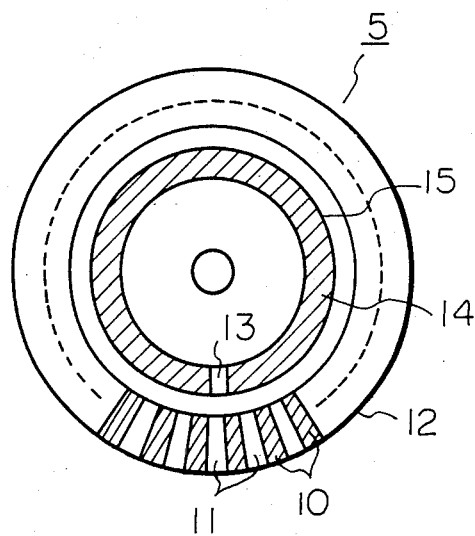
FIG. 2 is a plan view of one type of rotary lattice plate included in the pulse encoder of FIG. 1.

FIG. 2 is a plan view of the rotary lattice plate 5 of FIG. 1. In FIG. 2, the rotary lattice plate 5 is provided on the outer periphery thereof with a ring 12 having light-cutting portions 10 which are spaced an equal distance from each other and which are formed by metal evaporation. Between the light-cutting portions 10, a transparent portion 11 is provided. Thus, the light-cutting portions 10 and the transparent portions 11 form light-cutting strips. The rotary lattice plate 5 is provided on the inner periphery thereof with a ring 15 having only one transparent portion 13, the remaining portion of the ring 15 being a light-cutting region 14.

Figure 3:
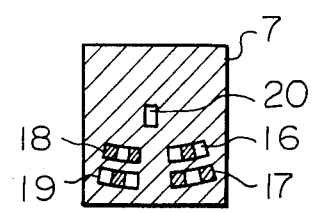
FIG. 3 is a plan view of one type of stationary lattice plate included in the pulse encoder of FIG. 1.

FIG. 3 is a plan view of the stationary lattice plate 7. In FIG. 3, the stationary lattice plate 7 has light-cutting stripes 16, 17, 18, and 19 which are provided so as to correspond to the ring 12 of the rotary lattice plate 5 of FIG. 2. The light-cutting stripes 16 through 19 are also formed by metal evaporation. Each light-cutting stripe includes one or two light-cutting portions and one or two transparent portions. The light-cutting stripes 16 and 17 arranged in a radial direction have phases differing from each other by 180°, as do the light-cutting stripes 18 and 19, also arranged in a radial direction. Also, the light-cutting stripes 16 and 18 arranged in a peripheral direction and the light-cutting stripes 17 and 19 arranged in a peripheral direction have phases differing from each other by 90°. The stationary lattice plate 7 also has a transparent portion 20 which is positioned so as to correspond to the transparent portion 13 of the rotary lattice plate 5.

When the LEDs $6_1$, $6_2$, and $6_3$ emit light during rotation of the rotary lattice plate 5, part of the light is transmitted through the transparent portions 11 in the rotary lattice plate 5 and through the transparent portions in the stationary lattice plate 7 to the light-receiving unit 8 and is converted into electric signals.

FIGS. 4A through 4E are waveform diagrams of the electric signals obtained at the output of the light-receiving unit 8.

FIG. 4A illustrates a waveform of an electric signal obtained from light transmitted through the transparent portions 11 of FIG. 2 and through the light-cutting stripe 16 of FIG. 3. Similarly, FIGS. 4B through 4D are waveforms of electric signals obtained from light transmitted through the transparent portions 11 and the light-cutting stripes 17, 18, and 19, respectively. As can be seen from FIGS. 4A and 4B and from FIGS. 4C and 4D, the waveforms of FIG. 4A and FIG. 4B have phases differing from each other by 180°, as do the waveforms of FIG. 4C and FIG. 4D. Such signals having phases differing from each other by 180° are useful in a numerical control device for improving its signal-to-noise characteristic. Also, the waveforms of FIGS. 4A and 4C have phases differing from each other by 90°, as do the waveforms of FIGS. 4B and 4D. Such signals having phases differing from each other by 90° are useful for detecting the direction of rotation of a motor. FIG. 4E illustrates a waveform of an electric signal obtained from light transmitted through the transparent portion 13 of FIG. 2 and the transparent portion 20 of FIG. 3. In FIG. 4E, one pulse is obtained by each rotation of the rotary lattice plate 5. By counting the pulses of FIG. 4E, the number of rotations of the rotating axle 2 of the motor 1 can be determined.

FIG. 5 is a circuit diagram illustrating a pulse encoder having a circuit for diagnosing abnormalities according to an embodiment of the present invention. In FIG. 5, the LEDs $6_1$ and $6_2$ are connected in series between a power supply $+E$ and the ground in such a manner that a current flows from the power supply $+E$ through the LEDs $6_1$ and $6_2$ to the ground. That is, the LED $6_1$ has an anode connected to the power supply $+E$, and the LED $6_2$ has a cathode connected through a resistor $R_1$ to the ground, the cathode of the LED $6_1$ being connected to the anode of the LED $6_2$. Similarly, the LED $6_3$ and a LED $6_D$ are connected in series in such a manner that the anode of the LED $6_3$ is connected to the power supply $+E$, the cathode of the LED $6_3$ is connected to the anode of the LED $6_D$, and the cathode of the LED $6_D$ is connected through a resistor $R_2$ to the ground. The LED $6_1$ is positioned so as to correspond to the light-cutting stripe 16 and 17 in the stationary lattice plate 7, and the LED $6_2$ is positioned so as to correspond to the light-cutting stripes 18 and 19 in the stationary lattice plate 7. The LED $6_3$ is positioned so as to correspond to the transparent portion 20 in the stationary lattice plate 7, and the LED $6_D$ is a dummy LED which is provided for equalizing the amount of light emitted from the LEDs $6_1$ and $6_2$ and that emitted from the LEDs $6_3$ and $6_D$.

Some of the light emitted from the LEDs $6_1$ through $6_3$ is received by photo cells $8_1$ through $8_3$ and then is converted by them into electric signals, as is illustrated in FIGS. 4A through 4E. These electric signals are input into a driving unit 9. The driving unit 9 includes three comparators $21_1$, $21_2$, and $21_3$. These comparators may be formed from operational amplifiers, for example. Each comparator $21_1$, $21_2$, and $21_3$ compare the two input signals from the photo cells $8_1$, $8_2$, and $8_3$, respectively, so as to provide a rectangular waveform signal at its output. The driving unit 9 also includes three driving circuits $22_1$, $22_2$, and $22_3$. The driving circuits $22_1$, $22_2$, and $22_3$ include the driving elements $23_1$, $23_2$, and $23_3$, respectively, for amplifying and shaping the rectangular waveform signals from the corresponding comparator $21_1$, $21_2$, and $21_3$ so as to provide at the two outputs of each respective driving element a non-inverted rectangular waveform signal and an inverted rectangular waveform signal. The driving circuits $22_1$, $22_2$, and $22_3$, also include output gate circuits $24_1$, $24_2$, and $24_3$, respectively. The output gate circuits $24_1$, $24_2$, and $24_3$ each include two output gates $25_{11}$ and $25_{12}$, $25_{21}$ and $25_{22}$, and $25_{31}$ and $25_{32}$, respectively. The two output gates receive, from the corresponding driving element $23_1$, $23_2$, or $23_3$, the non-inverted and inverted rectangular waveform signals, respectively, so as to provide a pair of output signals A and $\overline{A}$, B and $\overline{B}$, or Z and $\overline{Z}$. The output gates $25_{11}$ and $25_{12}$ have control terminals which are commonly connected to a control terminal $C_1$ of the driving circuit $22_1$. Similarly, the control terminals of the output gates $25_{21}$ and $25_{22}$ are connected to a control terminal $C_2$ of the driving circuit $22_2$, and the control terminals of the output gates $25_{31}$ and $25_{32}$ are connected to a control terminal $C_3$ of the driving circuit $22_3$.

Each of the driving circuits $22_1$, $22_2$, and $22_3$ itself is a well-known circuit and is commercially sold under the name of, for example, "SN75113, a dual differential line driver with three-state outputs", manufactured by Texas Instruments Incorporated.

In such an optical pulse encoder as mentioned above employing LEDs, the breaking of wire in the LEDs results in a fatal abnormality in the pulse encoder. Also, when the power supply voltage is lowered to a predetermined value of, for example, 3.5 V in a case in which the normal power supply voltage is 5 V, the elements in the electric circuit may cause an error in operation, resulting in an abnormality in the output signals of the pulse encoder.

A conventional pulse encoder does not have a circuit for detecting the breaking of wire in LEDs or lowering of the power supply voltage. Therefore, the output of the pulse encoder becomes indefinite when the above-mentioned abnormality occurs, often resulting in uncontrolled running of the numerical control device or the motor.

According to the present invention, the cathode of the LED $6_2$ is connected through a lead wire $l_1$ to the control terminal $C_1$ of the output gate circuit $24_1$ in the driving circuit $22_1$. When the wire in the LED $6_1$ or $6_2$ is broken, or when the voltage of the power supply $+E$ is lowered to a predetermined level, the voltage at the control terminal $C_1$ is also lowered, resulting in the output signals A and $\overline{A}$ from the output gate circuit $24_1$, assuming a low (L) level. The two outputs of the output gate circuit $24_1$ are connected to two inputs of an exclusive OR circuit (EOR) $26_1$. Therefore, when both of the output signals A and $\overline{A}$ assume an L level, the output of the EOR $26_1$ goes from a high (H) level to a low (L) level. The low (L) level of the output signal X of the EOR $26_1$ is an alarm signal. Thus, by observing the alarm signal X, the breaking of wire in the LED $6_1$ or $6_2$ or lowering of the power supply voltage can be detected.

Similarly, the cathode of the dummy LED $6_D$ is connected through a lead wire $l_2$ to the control terminal $C_2$ of the output gate circuit $24_2$ in the driving circuit $22_2$, and the two outputs of the output gate circuit $24_2$ are connected to two inputs of an EOR $26_2$. Thus, when the output signal Y assumes an L level, the breaking of wire in the LED $6_3$ or $6_D$ or lowering of the power supply voltage can also be detected.

In this embodiment, the control terminal $C_3$ of the output gate circuit $24_3$ is connected to the power supply +E. Therefore, the control terminal $C_3$ is not used for detecting the breaking of wire in LEDs.

FIGS. 6A through 6H are waveform diagrams of the output signals of the circuit of FIG. 5. In these figures, before a time t, the rectangular waveform of the output signal A and that of the output signal $\overline{A}$ have phases differing from each other by 180°.

This is also true of the rectangular waveforms of the pair of output signals B and $\overline{B}$ and of the pair of output signals Z and $\overline{Z}$. At the time t, when the wire of the LED $6_1$ or $6_2$ is broken, the potential at the cathode of the LED $6_2$, that is, the potential at the control terminal $C_1$ of the output gate circuit $24_1$ becomes 0 volts so that both of the output signals A and $\overline{A}$ assume an L level (FIGS. 6A and 6B). Therefore, the alarm signal X at the output of the EOR $26_1$ assumes an L level (FIG. 6G) and thus the abnormality can be detected.

Similarly, when the wire of the LED $6_3$ or $6_D$ is broken, the alarm signal Y at the output of the EOR $26_2$ assumes an L level so that the abnormality can be detected.

Also, when the power supply voltage assumes a level lower than 3.5 V, the potentials at the cathodes of the LEDs $6_2$ and $6_D$ assume a level lower than 1.2 V. Such a low voltage as 1.2 V is deemed an L level at the control terminals $C_1$ and $C_2$. Therefore, the output signals A and $\overline{A}$ and B and $\overline{B}$ of the output gate circuits $24_1$ and $24_2$, respectively, assume an L level, resulting in L levels at the outputs of the EORs $26_1$ and $26_2$. Thus, lowering of the power supply voltage can be detected.

If the system of the pulse encoder is so constructed that the operation of the numerical control device and the motor is stopped when the alarm signal X or Y assumes an L level, uncontrolled running of the numerical control device or the motor due to the breaking of wire in LEDs or due to lowering of the power supply voltage can be prevented.

The present invention is not restricted to the above-described embodiment, and various changes and modifications are possible without departing from the spirit of the present invention. For example, instead of employing the EORs for detecting the alarm signals, exclusive NOR gates may be employed. When the logic gate employed for generating an alarm signal is an EOR gate, an L level alarm signal is obtained when both inputs (e.g. A and $\overline{A}$) are L level. When the logic gate employed is an exclusive NOR gate, an H level alarm signal is obtained when both inputs (e.g. A and $\overline{A}$) are L level. Also, the cathode of the LED $6_D$ may alternatively be connected to the control terminal $C_3$ of the output gate circuit $24_3$ for providing the output signal Z. Further, between the cathode of the LED $6_2$ and the control terminal $C_1$ and between the cathode of the LED $6_D$ and the control terminal $C_2$, amplifiers may be connected.

From the foregoing description, it will be apparent that, according to the present invention, a pulse encoder having a circuit for diagnosing abnormalities can be obtained. The diagnosing of an abnormality in a power supply or in LEDs included in a pulse encoder is carried out at the output gate circuit in the output driving unit, whereby uncontrolled running of a numerical control unit or of a motor controlled by the numerical control unit can be prevented.

We claim:

1. A pulse encoder having a circuit for diagnosing abnormalities of a breakage of wiring in light-emitting elements of said pulse encoder, a lowering of power supply voltage applied to said pulse encoder, or a problem in an output transistor in a signal outputting element of said pulse encoder, which render an output signal of said pulse encoder indefinite, comprising:
   at least one light-emitting element having a first electrode connected to a power supply and a second electrode connected through a resistor to the ground;
   a rotary lattice plate having at least one first transparent portion for intermittently passing therethrough the light emitted from said light-emitting element;
   a stationary lattice plate having at least one second transparent portion for passing therethrough part of the light passed through said first transparent portion of said rotary lattice plate;
   at least one light-receiving element for receiving light passed through said second transparent portion so as to convert the light into an electrical signal; and
   a driving unit in operable connection with said at least one light-receiving element for converting the electrical signal from said light-receiving element into a rectangular waveform signal, said driving unit having an output gate circuit for outputting said rectangular waveform signal during conditions of operation of the pulse encoder in the absence of said abnormalities, said output gate circuit having a control terminal for controlling the output signal of said driving unit, said output gate circuit providing a constant-potential output signal whenever a potential applied at said control terminal is lower than a predetermined value;
   wherein said circuit for diagnosing abnormalities comprises:
   a lead wire connected at one end between the junction of said second electrode of said light-emitting element and said resistor, and at another end to said control terminal of said output gate circuit, for transferring said abnormalities from said light-emitting element to said output gate circuit; and
   means in operable connection with said output gate circuit, for providing an alarm signal whenever said output gate circuit provides said constant-potential output signal.

2. A pulse encoder as set forth in claim 1, wherein said output gate circuit in said driving unit comprises two output gates each providing a pair of non-inverted and inverted signals at respective paired outputs thereof during conditions of operation of the pulse encoder in the absence of said abnormalities.

3. A pulse encoder as set forth in claim 2 wherein said means for providing an alarm signal comprises a logic gate having inputs for receiving said pair of non-inverted and inverted signals and having an output for providing said alarm signal when said pair of non-inverted and inverted signals have the same and a constant potential.

4. A pulse encoder as set forth in claim 3 wherein said light-emitting element comprises two or more LEDs connected in series between said power supply and said resistor in such a manner that a current flows from said power supply through said series-connected LEDs and said resistor to the ground, said first electrode being an anode of one of said series-connected LEDs connected to said power supply and said second electrode being a cathode of one of said series-connected LEDs connected through said resistor to the ground.

5. A pulse encoder as set forth in claim 4 wherein at least one of said series-connected LEDs is positioned so that said first transparent portion of said rotary lattice plate intermittently passes therethrough the light emitted from said at least one of said series-connected LEDs.

6. A pulse encoder as set forth in claim 5 wherein said logic gate is an exclusive OR gate.

7. A pulse encoder as set forth in claim 5 wherein said logic gate is an exclusive NOR gate.

* * * * *